(12) United States Patent
Ochi et al.

(10) Patent No.: US 6,335,886 B1
(45) Date of Patent: Jan. 1, 2002

(54) SEMICONDUCTOR MEMORY DEVICE INCLUDING SPARE MEMORY CELL

(75) Inventors: Takehiro Ochi; Hisao Kobashi, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/725,149

(22) Filed: Nov. 29, 2000

(30) Foreign Application Priority Data

May 26, 2000 (JP) .......................................... 12-156210

(51) Int. Cl.[7] ................................................ G11C 7/00
(52) U.S. Cl. .................... 365/200; 365/203; 365/225.7; 365/230.06
(58) Field of Search .............................. 365/200, 225.7, 365/203, 230.06

(56) References Cited

U.S. PATENT DOCUMENTS

| 5,327,381 | A | * | 7/1994 | Johnson et al. | ............. 365/200 |
|---|---|---|---|---|---|
| 5,440,521 | A | * | 8/1995 | Tsunozaki et al. | ...... 365/230.03 |
| 5,848,007 | A | * | 12/1998 | Takahashi | .................... 365/200 |
| 5,903,575 | A | * | 5/1999 | Kikuda | ....................... 371/21.2 |
| 5,999,463 | A | * | 12/1999 | Park et al. | ................... 365/200 |
| 6,026,037 | A | * | 2/2000 | Hong | .......................... 365/200 |
| 6,154,399 | A | * | 11/2000 | Ogishima | .................... 365/200 |
| 6,201,745 | B1 | * | 3/2001 | Ryu et al. | .................... 365/200 |
| 6,205,050 | B1 | * | 3/2001 | Tamaki | ....................... 365/154 |

FOREIGN PATENT DOCUMENTS

| JP | 9-64715 | 3/1997 |
|---|---|---|
| JP | 10-92290 | 4/1998 |

* cited by examiner

Primary Examiner—Richard Elms
Assistant Examiner—Tuan T. Nguyen
(74) Attorney, Agent, or Firm—McDermott, Will & Emery (57) ABSTRACT

A redundancy row decoder in a DRAM includes a plurality of N channel MOS transistors connected in series between one terminal of each fuse and a line of a ground potential, the plurality of N channel MOS transistors having their gates receiving a predecode signal allocated to a corresponding word line. As compared with a conventional case where only one N channel MOS transistor is connected between one terminal of each fuse and the line of the ground potential, leakage current flowing through each fuse is made smaller.

9 Claims, 6 Drawing Sheets

FIG.6A /PC
FIG.6B X0
FIG.6C φH
FIG.6D φR
FIG.6E SWL
FIG.6F WL

TIME t →

SEMICONDUCTOR MEMORY DEVICE INCLUDING SPARE MEMORY CELL

BACKGROUND OF THE INVENTION

1. Field of the Invention

The present invention relates to semiconductor memory devices and more particularly to a semiconductor memory device including a spare memory cell for replacing a defective memory cell.

2. Description of the Background Art

In recent years, memory ICs such as dynamic random access memories (hereinafter, referred to as DRAMs) have come to have higher storage capacity of a memory device and higher integration of components. Therefore, it has become difficult to ensure a yield of at least a prescribed level by a method in which the entire memory IC is regarded as defective if only one of a plurality of memory cells is defective. Consequently, a method of repairing a memory IC having a defective memory cell by providing a redundancy circuit in the IC has been generally employed.

According to the method, a spare memory cell is previously formed in a memory IC and, if a defective memory cell is encountered, the defective memory cell is replaced by the spare memory cell to repair the memory IC having the defective memory cell. In this method, a defective memory cell is replaced by a spare memory cell in a memory IC which has completed its wafer process, and thus replacement is generally carried out by blowing a fuse. Although a fuse is blown by an electric fuse method of blowing a fuse using an overcurrent, a laser blow method of blowing a fuse using a laser beam, and the like, the laser blow method allowing a higher degree of freedom for designing is generally employed.

Figure 9:
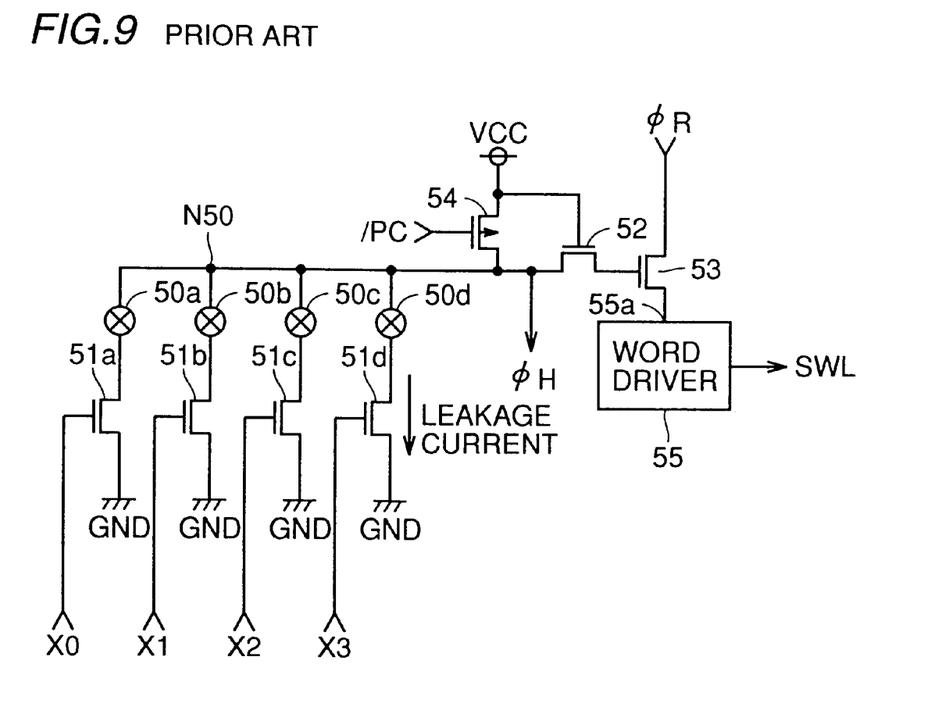
FIG. 9 is a circuit block diagram showing a configuration of a redundancy row decoder in a conventional DRAM.

FIG. 9 is a circuit block diagram showing a configuration of a redundancy row decoder in a DRAM for which such a redundancy method is employed. In FIG. 9, the redundancy row decoder includes fuses 50a to 50d, N channel MOS transistors 51a to 51d, 52, 53, a P channel MOS transistor 54, and a word driver 55.

P channel MOS transistor 54 is connected between a line of a power supply potential VCC and a node N50, and has its gate receiving a precharge signal/PC. Signal/PC is in a logic low or L level active state in a standby mode, and in the L level active state for a prescribed time period before word line selection in an active mode. When signal/PC attains the L level active state, P channel MOS transistor 54 is rendered conductive and node N50 is precharged to a logic high or H level.

Fuses 50a to 50d each have its one terminal connected to node N50. N channel MOS transistors 51a to 51d are connected between the other terminals of fuses 50a to 50d and a line of a ground potential GND, and have their gates receiving predecode signals X0 to X3, respectively.

Here, the number of word lines is four for simplicity of the figure and description. Predecode signals X0 to X3 are previously allocated to the four word lines, respectively. Fuses 50a to 50d are also previously allocated to the four word lines, respectively. Each of fuses 50a to 50d is blown if a corresponding word line is defective and the word line is replaced by a spare word line SWL. Only one of fuses 50a to 50d can be blown.

When one signal (X0, for example) of signals X0 to X3 attains an H level active state, N channel MOS transistor 51a corresponding to signal X0 is rendered conductive. If fuse 50a corresponding to signal X0 has not been blown, node N50 falls from an H level to an L level. Node N50 remains to be at the H level if fuse 50a has been blown. A signal appearing on node N50 serves as a hit signal φH. Hit signal φH is applied to the gate of N channel MOS transistor 53 through N channel MOS transistor 52. The gate of N channel MOS transistor 52 receives power supply potential VCC. N channel MOS transistor 52 is provided to protect N channel MOS transistor 53.

When hit signal φH is at an H level, N channel MOS transistor 53 is rendered conductive, and a word line selection signal φR is applied to a control node 55a of word driver 55 through N channel MOS transistor 53. When hit signal φH is at an L level, N channel MOS transistor 53 is rendered non-conductive, and word line selection signal φR is not applied to word driver 55. Word driver 55 raises spare word line SWL to an H level selected state in response to word line selection signal φR. On the other hand, when hit signal φH is at the H level, the four word lines are all fixed to an L level non-selected state. As a result, a word line corresponding to a row including a defective memory cell has been replaced by spare word line SWL.

Since the conventional redundancy row decoder has such a configuration as described above, leakage current is caused in a standby state from node N50, which is kept at the H level, through fuses 50a to 50d and N channel MOS transistors 51a to 51d to the ground potential GND line. Although the leakage current for one fuse is small, the overall leakage current is larger because the number of word lines, that is, the number of fuses has increased due to the recent higher storage capacity and higher integration in a memory IC. Since a lower operating current for a memory IC has been promoted on the other hand, the leakage current of a redundancy row decoder has come to have a level that cannot be ignored for the operating current.

SUMMARY OF THE INVENTION

Therefore, a major object of the present invention is to provide a semiconductor memory device having small leakage current.

According to one aspect of the present invention, a redundancy decoder includes: a precharge circuit activated before an address signal is applied, and charging its output node to a first potential; a fuse provided corresponding to each memory cell, having one terminal connected to the output node of the precharge circuit, and blown when a corresponding memory cell is defective; a plurality of transistors provided corresponding to each memory cell, connected in series between the other terminal of a corresponding fuse and a line of a second potential, and rendered conductive in response to the address signal allocated to the corresponding memory cell being applied; and a driver activating a spare memory cell when the output node of the precharge circuit has the first potential after the address signal is applied. Therefore, as compared with a conventional case where only one transistor is connected between the other terminal of the fuse and the line of the second potential, a resistance value between the other terminal of the fuse and the line of the second potential is larger during the precharge period and leakage current flowing through each fuse is smaller.

According to another aspect of the present invention, a redundancy decoder includes: a precharge circuit activated before an address signal is applied, and charging its output node to a first potential; a fuse provided corresponding to each memory cell, having one terminal connected to the output node of the precharge circuit, and blown when a corresponding memory cell is defective; a first transistor provided corresponding to each memory cell, having a first electrode connected to the other terminal of a corresponding fuse, and rendered conductive in response to the address signal allocated to a corresponding memory cell being applied; a second transistor connected between a second electrode of the first transistor and a line of a second potential, and rendered non-conductive while the precharge circuit is active; and a driver activating a spare memory cell when the output node of the precharge circuit has the first potential after the address signal is applied. As described above, while the precharge circuit is active, the second transistor is non-conductive and the second electrode of the first transistor is in a floating state. As compared with a conventional case where the second electrode of the first transistor is always connected to the line of the second potential, therefore, leakage current flowing through each fuse is smaller.

Preferably, the second transistor is provided commonly to the plurality of first transistors. In this case, only one second transistor is sufficient and the layout area is made smaller.

Preferably, the decoder is activated in response to the output node of the precharge circuit attaining the second potential. In this case, activation of both the memory cells and the spare memory cell can be prevented easily.

Preferably, the semiconductor memory device has a standby mode and an active mode, and the precharge circuit is always active in the standby mode and active for a prescribed period before the address signal is applied in the active mode. In this case, leakage current in the standby mode and leakage current for the prescribed period in the active mode can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
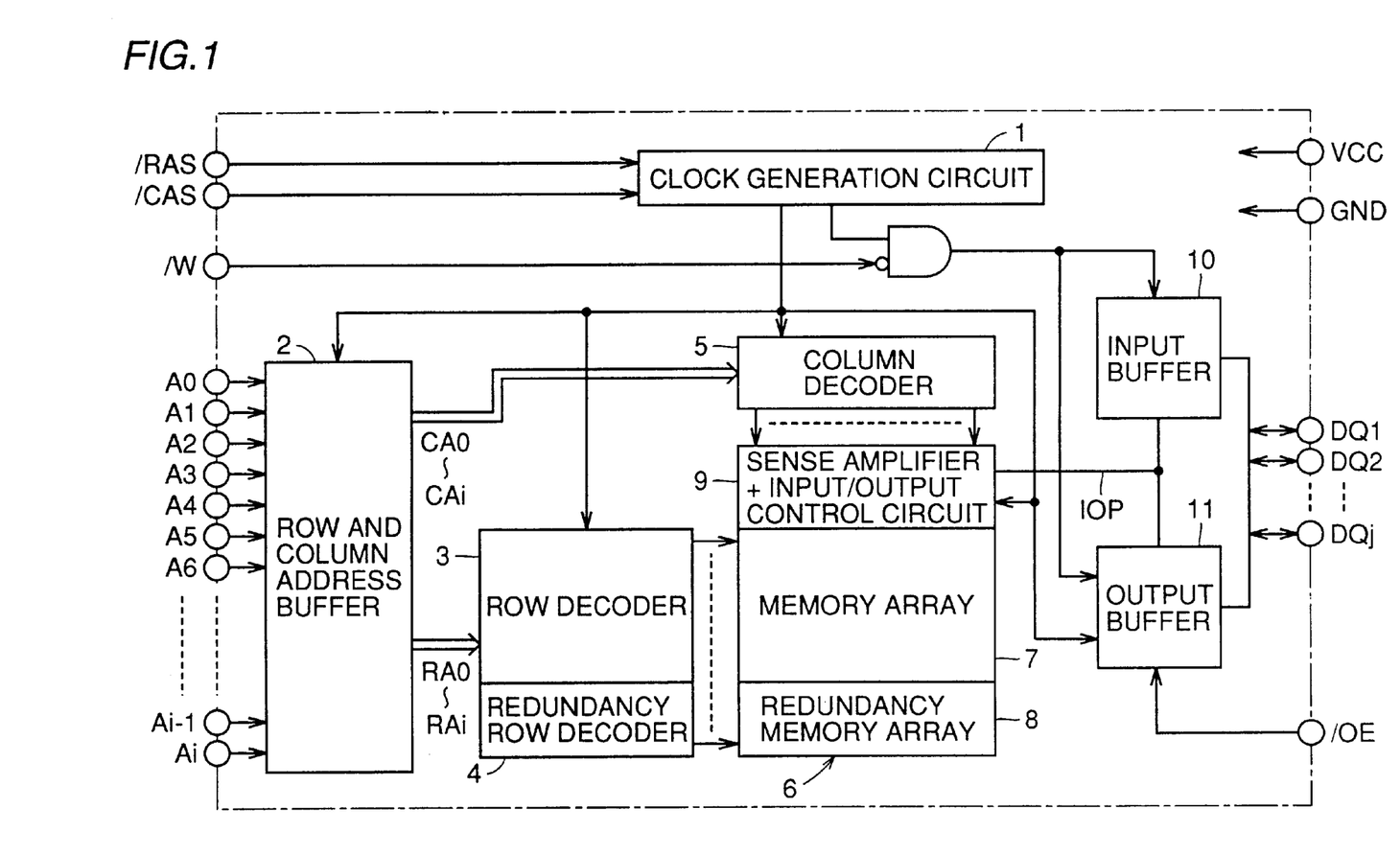
FIG. 1 is a block diagram showing an overall configuration of a DRAM according to a first embodiment of the present invention.

FIG. 1 is a block diagram showing a configuration of a DRAM according to a first embodiment of the present invention. Referring to FIG. 1, the DRAM includes a clock generation circuit 1, a row and column address buffer 2, a row decoder 3, a redundancy row decoder 4, a column decoder 5, a memory mat 6, an input buffer 10, and an output buffer 11. Memory mat 6 includes a memory array 7, a redundancy memory array 8, and a sense amplifier+input/output control circuit 9.

Clock generation circuit 1 selects a prescribed operation mode according to externally applied signals /RAS, /CAS and thus controls the entire DRAM.

Row and column address buffer 2 generates a row address signal RA0 to RAi and a column address signal CA0 to CAi according to an externally applied address signal A0 to Ai (i is an integer of at least 0), and applies generated signals RA0 to RAi and CA0 to CAi to row decoders 3, 4 and column decoder 5, respectively.

Memory array 7 includes a plurality of memory cells arranged in a matrix and each storing 1-bit data. Each memory cell is arranged at a prescribed address determined by row and column addresses.

Row decoder 3 designates a row addresses in memory array 7 according to row address signal RA0 to RAi applied from row and column address buffer 2. In redundancy row decoder 4 are provided fuses for programming a row address including a defective memory cell in memory array 7 and a row address in redundancy memory array 8, which replaces the row address including a defective cell. When row address signal RA0 to RAi is input that corresponds to a defective row address programmed by the fuses, row decoder 3 does not designate the row address, and redundancy row decoder 4 designates, instead of the row address, a programmed row address in redundancy memory array 8. In short, a defective memory cell row including a defective memory cell in memory array 7 is replaced by a normal memory cell row in redundancy memory array 8.

Column decoder 5 designates a column address in memory array 7 according to column address signal CA0 to CAi applied from row and column address buffer 2. Sense amplifier+input/output control circuit 9 connects a memory cell at an address designated by row decoder 3 (or redundancy row decoder 4) and column decoder 5 to one end of a data input/output line pair IOP. The other end of data input/output line pair IOP is connected to input buffer 10 and output buffer 11. In a writing mode, input buffer 10 is responsive to an externally applied signal /W for applying externally received data Dj (j is a natural number) to a selected memory cell through data input/output line pair IOP. In a reading mode, output buffer 11 is responsive to an externally received signal /OE for applying read data Qj from a selected memory cell as an output.

Figure 2:
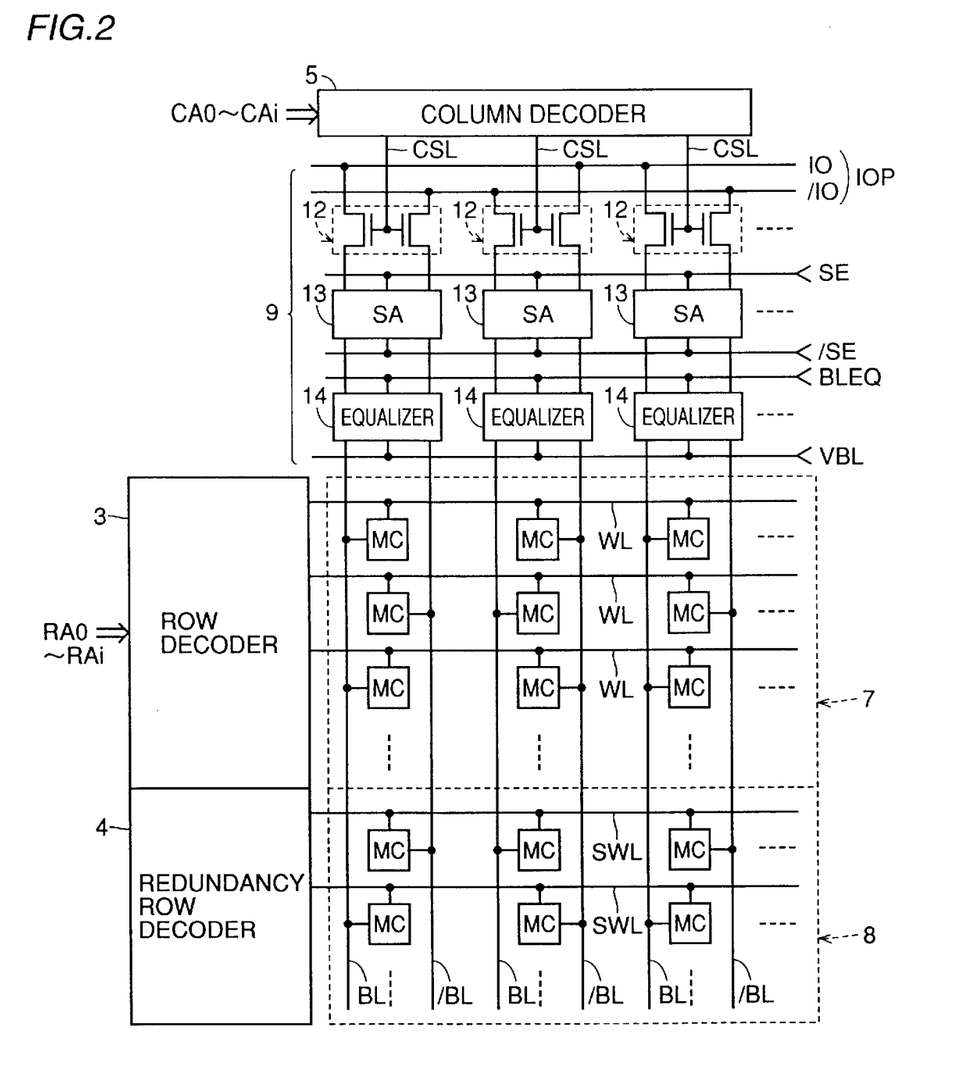
FIG. 2 is a circuit block diagram showing a configuration of the memory mat shown in FIG. 1.

FIG. 2 is a partially omitted circuit block diagram showing a configuration of memory mat 6 in the DRAM shown in FIG. 1.

In FIG. 2, memory array 7 includes a plurality of memory cells MC arranged in a matrix, a word line WL provided corresponding to each row, and a pair of bit lines BL, /BL provided corresponding to each column.

Each memory cell MC is a well known cell including an N channel MOS transistor for accessing and a capacitor for storing information. Word line WL transmits an output of row decoder 3 and activates memory cells MC in a selected row. A pair of bit lines BL, /BL communicates a data signal with selected memory cell MC.

Redundancy memory array 8 has the same semi-configuration as memory array 7 except that the number of rows is smaller than in memory array 7. Memory array 7 and redundancy memory array 8 have the same number of columns, and a pair of bit lines BL, /BL is shared by memory array 7 and redundancy memory array 8. A word line in redundancy memory array 8 is called a spare word line SWL.

Sense amplifier+input/output control circuit 9 includes a pair of data input/output lines IO, /IO (IOP), and a column selection gate 12, a sense amplifier 13 and an equalizer 14 provided corresponding to each column. Column selection gate 12 includes a pair of N channel MOS transistors connected between a pair of bit lines BL, /BL and a pair of data input/output lines IO, /IO. The gate of each N channel MOS transistor is connected to column decoder 5 through a column selection line CSL. When column selection line CSL is raised to an H level selected state by column decoder 5, the pair of N channel MOS transistors are rendered conductive, and the pair of bit lines BL, /BL and the pair of data input/output lines IO, /IO are coupled.

Sense amplifier 13 amplifies a slight potential difference between a pair of bit lines BL, /BL to the level of a power supply voltage VCC when sense amplifier activation signals SE, /SE are at H and L levels, respectively. Equalizer 14 equalizes the potentials of a pair of bit lines BL, /BL to a bit line potential VBL (=VCC/2) in response to a bit line equalize signal BLEQ attaining an H level active state.

In the following, an operation of the DRAM shown in FIGS. 1 and 2 will be described. In the writing mode, column decoder 5 raises column selection line CSL in a column corresponding to column address signal CA0 to CAi to an H level selected state, and column selection gate 12 in the column is rendered conductive.

In response to signal /W, input buffer 10 applies external write data Dj to a pair of bit lines BL, /BL in the selected column through data input/output line pair IOP. Write data Dj is applied as a potential difference between bit lines BL, /BL. Then, row decoder 3 raises word line WL in a row corresponding to row address signal RA0 to RAi to an H level selected state, and N channel MOS transistors of memory cells MC in the column are rendered conductive. Electric charges of such an amount corresponding to the potential of bit line BL or /BL are stored in the capacitor of selected memory cell MC.

In the reading mode, bit line equalize signal BLEQ first falls to an L level and equalization of bit lines BL, /BL is stopped. Then, row decoder 3 raises word line WL in a row corresponding to row address signal RA0 to RAi to the H level selected state, and N channel MOS transistors of memory cells MC in that row are rendered conductive. Thus, the potentials of bit lines BL, /BL are slightly changed according to the amount of electric charges at a capacitor of activated memory cell MC.

Thereafter, sense amplifier activation signals SE, /SE attain H and L levels, respectively, and sense amplifier 13 is activated. When the potential of bit line BL is slightly higher than the potential of bit line /BL, the potential of bit line BL is raised to an H level and the potential of bit line /BL is lowered to an L level. Conversely, when the potential of bit line /BL is slightly higher than the potential of bit line BL, the potential of bit line /BL is raised to the H level and the potential of bit line BL is lowered to the L level.

Thereafter, column decoder 5 raises column selection line CSL corresponding to column address signal CA0 to CAi to the H level selected state, and column selection gate 12 in that column is rendered conductive. Data on the pair of bit lines BL, /BL in the selected column is applied to output buffer 11 through column selection gate 12 and the pair of data input/output lines IO, /IO. Output buffer 11 provides read data Qj as an output in response to signal /OE.

When row address signal RA0 to RAi corresponds to a row including defective memory cell MC, writing and reading operations are performed similarly except that spare word line SWL in redundancy memory array 8 is selected instead of word line WL in the row including defective memory cell MC.

As described above, a memory IC such as a DRAM employs the method of replacing a defective row or column with a spare row or column to improve a yield of chips on wafers. In the following, row decoder 3 and redundancy row decoder 4 as a feature of the present invention will be described in detail.

Figure 3:
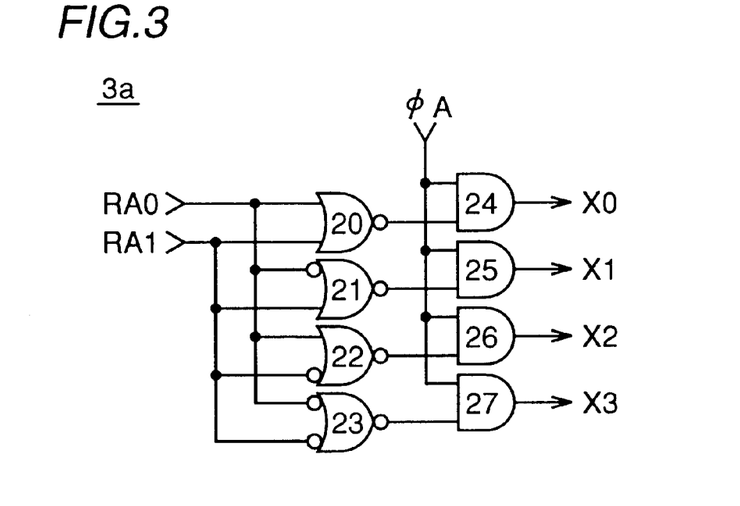
FIG. 3 is a circuit diagram showing a configuration of a predecoder included in the row decoder shown in FIG. 2.

FIG. 3 is a circuit diagram showing a configuration of a predecoder 3a included in row decoder 3. In the following, the number of word lines WL is four and the number of spare word line SWL is one for simplicity of the drawings and description.

In FIG. 3, predecoder 3a includes gate circuits 20 to 23 and AND gates 24 to 27. Gate circuits 20 to 23 each receive row address signal RA0, RA1. Gate circuit 20 outputs an H level (1) only when RA0, RA1 are at an L level (0). Gate circuit 21 outputs the H level only when RA0, RA1 are at H and L levels, respectively. Gate circuit 22 outputs the H level only when RA0, RA1 are at the L and H levels, respectively. Gate circuit 23 outputs the H level only when RA0, RA1 are at the H level.

Each of the output signals of gate circuits 20 to 23 is input to one input node of each of corresponding AND gates 24 to 27. The other input node of each of AND gates 24 to 27 is supplied with a signal $\phi A$. Signal $\phi A$ is at an L level in the standby mode and at an H level in the active mode. Output signals of AND gates 24 to 27 are predecode signals X0 to X3, respectively. Predecode signals X0 to X3 are allocated to four word lines WL, respectively.

In the standby mode, signals X0 to X3 are all at an L level. In the active mode, one signal of signals X0 to X3 is at an H level (1) according to row address signal RA0, RA1 as shown in the following table.

TABLE 1

| RA0 | RA1 | X0 | X1 | X2 | X3 |
|-----|-----|----|----|----|----|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

Figure 4:
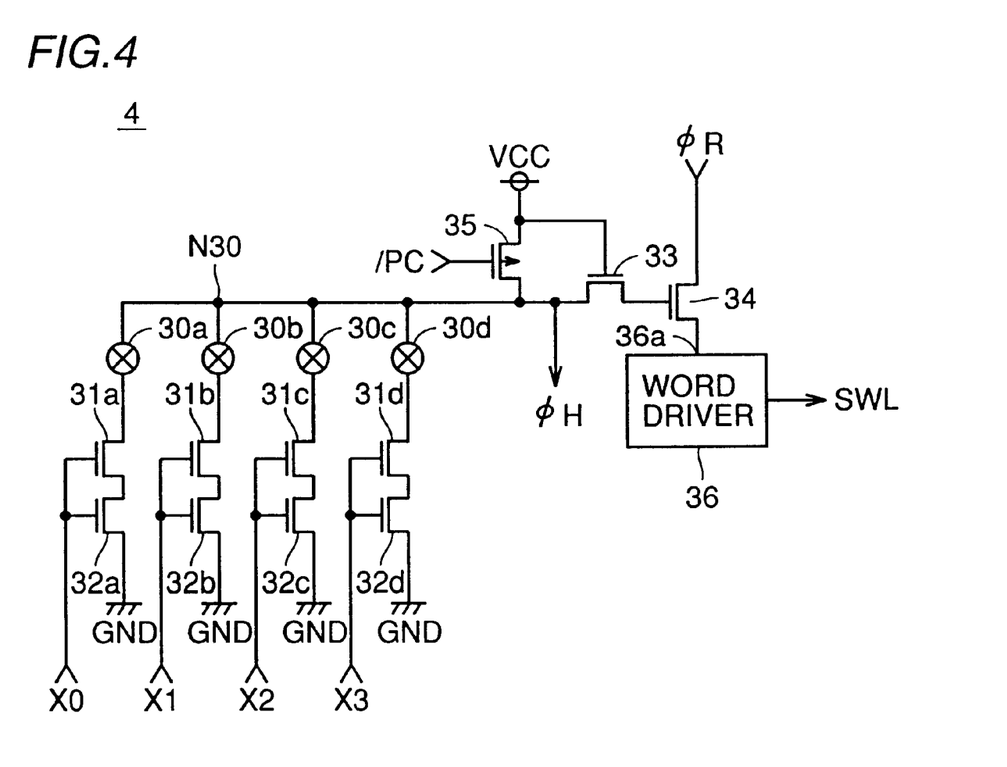
FIG. 4 is a circuit block diagram showing a configuration of the redundancy row decoder shown in FIG. 2.

FIG. 4 is a circuit block diagram showing a configuration of redundancy row decoder 4. In FIG. 4, redundancy row decoder 4 includes fuses 30a to 30d, N channel MOS transistors 31a to 31d, 32a to 32d, 33, 34, a P channel MOS transistor 35, and a word driver 36.

P channel MOS transistor 35 is connected between a line of a power supply potential VCC and a node N30 and has its gate receiving a precharge signal /PC. Signal /PC is in an L level active state in the standby mode and in the L level active state only for a prescribed period before selection of word lines WL, SWL in the active mode. When signal /PC attains the L level active state, P channel MOS transistor 35 is rendered conductive and node N30 is precharged to an H level.

One terminal of each of fuses 30a to 30d is connected to node N30. N channel MOS transistors 31a to 31d have their drains respectively connected to the other terminals of fuses 30a to 30d, and their gates respectively receiving signals X0 to X3. N channel MOS transistors 32a to 32d are connected between the sources of N channel MOS transistors 31a to 31d and a line of a ground potential GND, and have their gates receiving signals X0 to X3, respectively.

Fuses 31a to 31d are previously allocated to four word lines WL, respectively. Each of fuses 30a to 30d is blown if a corresponding word WL line is defective and that word line WL is replaced by spare word line SWL. Only one of fuses 30a to 30d can be blown.

When one signal (X0, for example) of signals X0 to X3 attains the H level active state according to row address signal RA0, RA1, N channel MOS transistors 31a, 32a corresponding to signal X0 are rendered conductive. If fuse 30a corresponding to signal X0 has not been blown, the level of node N30 falls from the H level to the L level. If fuse 30a has been blown, the level of node N30 does not change. A signal appealing on node N30 is a hit signal φH.

N channel MOS transistor 33 is connected between node N30 and the gate of N channel MOS transistor 34, and has its gate receiving power supply potential VCC. N channel MOS transistor 33 is provided to protect N channel MOS transistor 34. N channel MOS transistor 34 has its drain receiving a word line selection signal OR and its source connected to a control node 36a of word driver 36. Word driver 36 drives spare word line SWL to an L level non-selected state when control node 36a is at an L level, and drives spare word line SWL to an H level selected state when control node 36a is at an H level.

Figure 5:
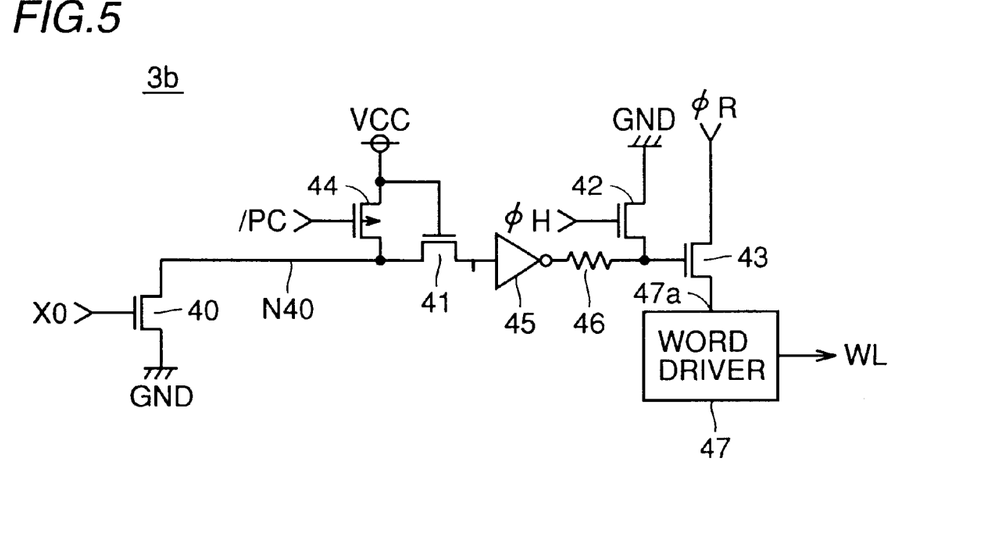
FIG. 5 is a circuit block diagram showing a configuration of a row decoder unit circuit included in the row decoder shown in FIG. 2.
Figures 6A, 6B:
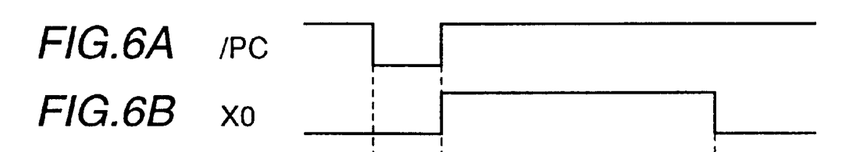
FIGS. 6A to 6F are timing charts illustrating a row selection operation of the DRAM shown in FIGS. 1 to 5.
Figures 6C, 6D:
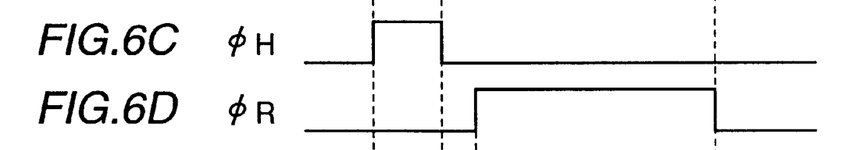
Figures 6E, 6F:
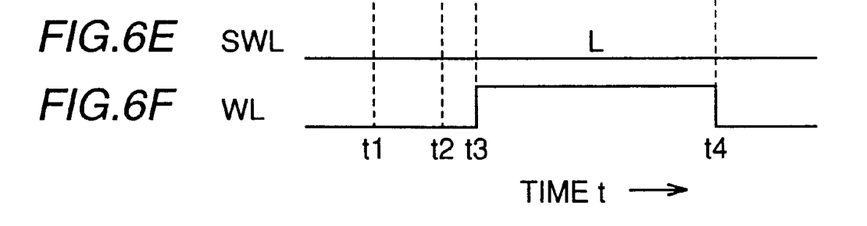
Figure 7A:
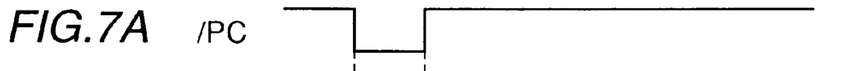
FIGS. 7A to 7F are other timing charts illustrating a row selection operation of the DRAM shown in FIGS. 1 to 5.
Figure 7B:
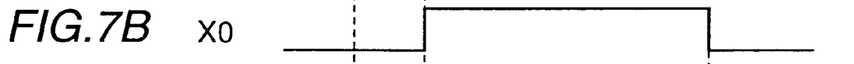
Figure 7C:
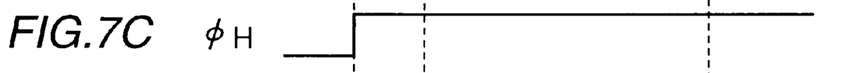
Figure 7D:
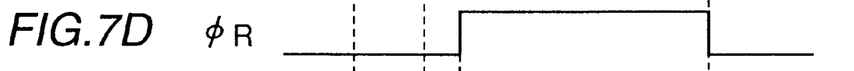
Figure 7E:
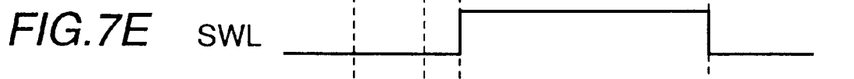
Figure 7F:
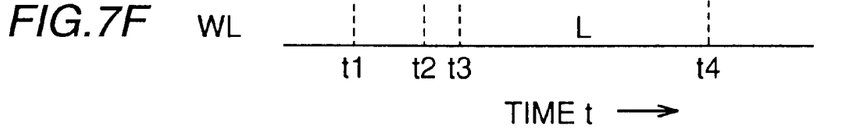

FIG. 5 is a circuit block diagram showing a configuration of a row decoder unit circuit 3b included in row decoder 3. Row decoder unit circuit 3b is provided corresponding to each word line WL. In FIG. 5, row decoder unit circuit 3b corresponding to word line WL to which predecode signal X0 is allocated is shown. In FIG. 5, row decoder unit circuit 3b includes N channel MOS transistors 40 to 43, a P channel MOS transistor 44, an inverter 45, a resistor 46, and a word driver 47.

P channel MOS transistor 44 is connected between a line of power supply potential VCC and a node N40, and has its gate receiving precharge signal /PC. When signal /PC is at the L level active state only for a prescribed period, P channel MOS transistor 44 is rendered conductive and node N40 is precharged to an H level.

N channel MOS transistor 40 is connected between node N40 and a line of ground potential GND, and has its gate receiving corresponding predecode signal X0. When signal X0 attains the H level active state, N channel MOS transistor 40 is rendered conductive and the level of node N40 falls from the H level to an L level.

N channel MOS transistor 41 is connected between node N40 and an input node of inverter 45, and has its gate receiving power supply potential VCC. N channel MOS transistor 41 is provided to protect inverter 45. An output signal of inverter 45 is applied to the gate of N channel MOS transistor 43 through resistor 46. N channel MOS transistor 42 is connected between the gate of N channel MOS transistor 43 and a line of ground potential GND, and has its gate receiving hit signal φH. When hit signal φH is in an H level active state, N channel MOS transistor 42 is rendered conductive, the gate of N channel MOS transistor 43 attains an L level, and N channel MOS transistor 43 is rendered non-conductive.

N channel MOS transistor 43 has its drain receiving word line selection signal φR, and its source connected to a control node 47a of word deliver 47. Word driver 47 drives corresponding word line WL to an L level non-selected state when control node 47a is at an L level, and drives corresponding word line WL to an H level selected state when control node 47a is at an H level.

In the following, an operation of row decoders 3, 4 shown in FIGS. 3 to 5 will be described. FIGS. 6A to 6F are timing charts illustrating an operation when word line WL corresponding to predecode signal X0 is normal and the normal word line WL is selected. In this case, fuse 30a corresponding to signal X0 is not blown.

When precharge signal /PC falls to the L level active state at time t1, P channel MOS transistor 35 in FIG. 4 is rendered conductive and thereby the level of node N30, that is, hit signal φH is raised to the H level, and P channel MOS transistor 44 in FIG. 5 is rendered conductive and thereby the level of node N40 is raised to the H level.

When precharge signal /PC is raised to an H level inactive state at time t2, P channel MOS transistors 35, 44 are rendered non-conductive and precharging of nodes N30, N44 is stopped. At the same time, predecode signal X0 is raised to the H level active state, N channel MOS transistors 31a, 32a in FIG. 4 are rendered conductive and thereby signal φH is lowered to an L level, and N channel MOS transistor 40 in FIG. 5 is rendered conductive and thereby node N4 is driven to an L level. Thus, N channel MOS transistor 34 in FIG. 4 is rendered non-conductive and N channel MOS transistor 43 in FIG. 5 is rendered conductive.

When word line selection signal φR then rises to an H level active state at time t3, word driver 47 in FIG. 5 is activated, and word driver 47 raises word line WL corresponding to predecode signal X0 to the H level selected state. Since N channel MOS transistor 34 in FIG. 4 is non-conductive, word driver 36 is not activated and spare word line SWL remains to be at the L level non-selected state. When signals X0, φR attain the L level inactive state at time t4, word line WL attains the L level non-selected state.

FIGS. 7A to 7F are timing charts illustrating an operation when word line WL corresponding to predecode signal X0 is defective and that defective word line WL is selected. In this case, fuse 30a corresponding to signal X0 is blown.

The operation is the same as the one described with reference to FIGS. 6A to 6F till precharge signal/PC attains the L level active state and nodes N30, N40 are precharged to the H level at time t1 to t2. When predecode signal X0 is raised to the H level active state at time t2, N channel MOS transistors 31a, 32a in FIG. 4 are rendered conductive although hit signal φH remains to be at the H level since fuse 30a has been blown.

Meanwhile, when predecode signal X0 is raised to the H level active state, N channel MOS transistor 40 in FIG. 5 is rendered conductive, node N40 attains the L level, and inverter 45 outputs an H level. Since signal φH is at the H level, however, N channel MOS transistor 42 is rendered conductive and the gate of N channel MOS transistor 43 remains to be at the L level. Therefore, N channel MOS transistor 34 in FIG. 4 is rendered conductive and N channel MOS transistor 43 in FIG. 5 is also rendered conductive.

When word line selection signal φR then rises to the H level active state at time t3, word driver 36 in FIG. 4 is activated, and word driver 36 raises spare word line SWL to the H level selected state. Since N channel MOS transistor 43 in FIG. 5 is non-conductive, word driver 47 is not activated, and defective word line WL corresponding to predecode signal X remains to be at the L level non-selected state. When signals X0, φR attain the L level inactive state at time t4, spare word line SWL attains the L level non-selected state.

In the first embodiment, a plurality of N channel MOS transistors are connected in series between the other electrodes of fuses 30a to 30d and the line of ground potential GND, and therefore leakage current is smaller when precharge signal /PC is active as compared with a conventional case where only one N channel MOS transistor is connected.

In the first embodiment, the description is based on the case where the present invention is applied to a method of replacing a memory cell row including a defective memory cell with a spare memory cell row. However, the present invention is naturally applicable to a method of replacing a memory cell column including a defective memory cell with a spare memory cell column.

Second Embodiment

Figure 8:
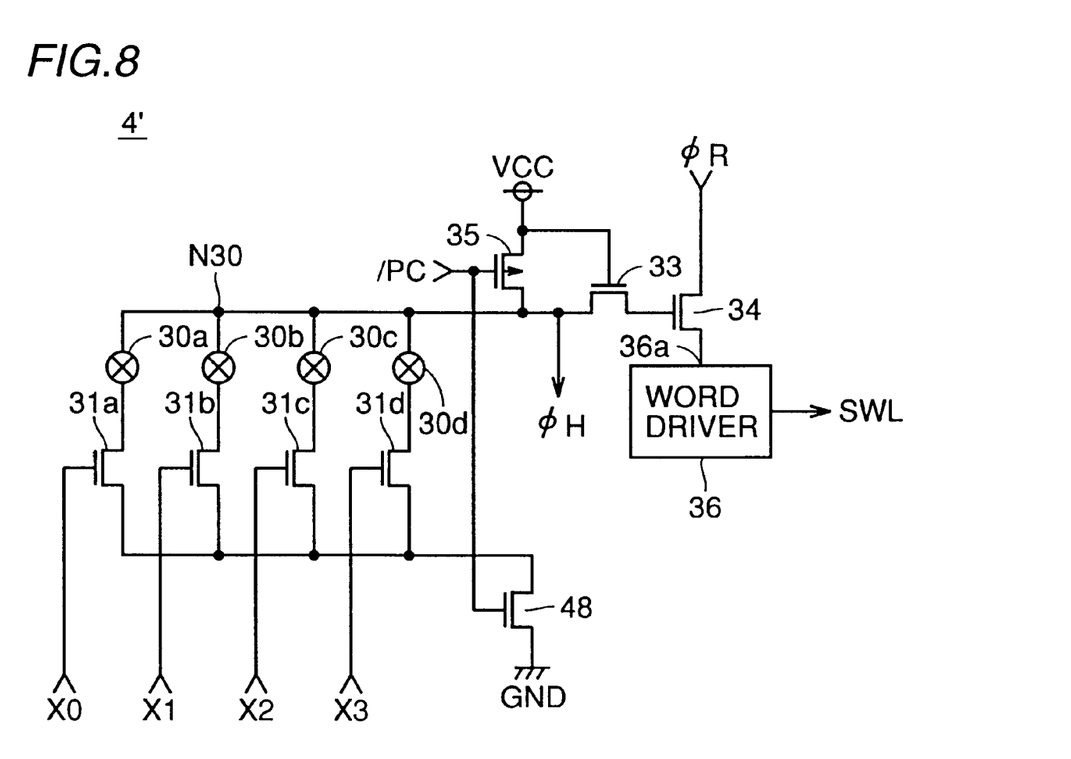
FIG. 8 is a circuit block diagram showing a configuration of a redundancy row decoder in a DRAM according to a second embodiment of the present invention.

FIG. 8 is a circuit block diagram showing a configuration of a redundancy row decoder 4' in a DRAM according to a second embodiment of the present invention.

Referring to FIG. 8, redundancy row decoder 4 is different from redundancy row decoder 4 of FIG. 4 in that N channel MOS transistors 32a to 32d are removed and a N channel MOS transistor 48 is added. N channel MOS transistors 31a to 31d have their sources all connected to the drain of N channel MOS transistor 48. N channel MOS transistor 48 has its source connected to a line of ground potential GND and its gate receiving precharge signal /PC.

When precharge signal /PC is at the L level active state, P channel MOS transistor 35 is conductive and N channel MOS transistor 48 is non-conductive, and thus node N30 is charged to the H level. When precharge signal /PC is at the H level inactive state, P channel MOS transistor 35 is non-conductive and N channel MOS transistor 48 is conductive, and thus the sources of N channel MOS transistors 31a to 31d are grounded. Since configuration of other parts and operation are the same as the DRAM in the first embodiment, description thereof will not be repeated.

In the second embodiment, N channel MOS transistor 48 is provided between the sources of N channel MOS transistors 31a to 31d and the line of ground potential GND and, when precharge signal/PC is active, N channel MOS transistor 48 is non-conductive and the sources of N channel MOS transistors 31a to 31d are in a floating state. Therefore, as compared with a conventional case where the sources of N channel MOS transistors 31a to 31d are always grounded, leakage current is smaller when precharge signal /PC is active.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells to each of which a unique address signal is allocated in advance;
   a spare memory cell for replacing a defective memory cell of said plurality of memory cells;
   a decoder provided corresponding to each memory cell, and activating a corresponding memory cell in response to the address signal allocated to the corresponding memory cell being applied;
   a redundancy decoder inactivating said decoder and activating said spare memory cell in response to the address signal allocated to said defective memory cell being applied; and
   a write/read circuit writing and reading data of the memory cell activated by said decoder and the memory cell activated by said redundancy decoder,
   said redundancy decoder including
      a precharge circuit activated before said address signal is applied and charging an output node to a first potential,
      a fuse provided corresponding to each memory cell, having one terminal connected to the output node of said precharge circuit, and blown when a corresponding memory cell is defective,
      a plurality of transistors provided corresponding to each memory cell, connected in series between another terminal of a corresponding fuse and a line of a second potential, and rendered conductive in response to the address signal allocated to a corresponding memory cell being applied, and
      a driver activating said spare memory cell when the output node of said precharge circuit has said first potential after said address signal is applied.

2. The semiconductor memory device according to claim 1, wherein said decoder is activated in response to the output node of said precharge circuit attaining said second potential.

3. The semiconductor device according to claim 1, wherein said semiconductor memory device has a standby mode and an active mode, and
   said precharge circuit is always active in said standby mode and active for a prescribed period before said address signal is applied in said active mode.

4. The semiconductor memory device according to claim 1, wherein
   a plurality of predecode signals are respectively allocated in advance to said plurality of memory cells,
   said semiconductor memory device further comprises a predecoder selecting any one of said plurality of predecode signals in accordance with an external address signal and setting the selected predecode signal to be at an active level,
   said decoder activates a corresponding memory cell in response to a predecode signal allocated to the corresponding memory cell set to be at the active level, and
   each of said plurality of transistors receives, at an input electrode of said each transistor, a predecode signal corresponding to a corresponding memory cell, and is rendered conductive in response to the predecode signal set to be at the active level.

5. A semiconductor memory device, comprising:
   a plurality of memory cells to each of which a unique address signal is allocated in advance;
   a spare memory cell for replacing a defective memory cell of said plurality of memory cells;
   a decoder provided corresponding to each memory cell and activating a corresponding memory cell in response to the address signal allocated to the corresponding memory cell being applied;
   a redundancy decoder inactivating said decoder and activating said spare memory cell in response to the address signal allocated to said defective memory cell being applied; and
   a write/read circuit writing and reading data of the memory cell activated by said decoder and the spare memory cell activated by said redundancy decoder,
   said redundancy decoder including
      a precharge circuit activated before said address signal is applied and charging an output node to a first potential, a fuse provided corresponding to each memory cell, having one terminal connected to the output node of said precharge circuit, and blown when a corresponding memory cell is defective, a first transistor provided corresponding to each memory cell, having a first electrode connected to another terminal of a corresponding fuse, and rendered conductive in response to the address signal allocated to a corresponding memory cell being applied, a second transistor connected between a second electrode of said first transistor and a line of a second potential and rendered non-conductive while said precharge circuit is active, and a driver activating said spare memory cell when the output node of said precharge circuit has said first potential after said address signal is applied.

6. The semiconductor memory device according to claim 5, wherein said second transistor is provided commonly to a plurality of said first transistors.

7. The semiconductor memory device according to claim 5, wherein said decoder is activated in response to the output node of said precharge circuit attaining said second potential.

8. The semiconductor memory device according to claim 5, wherein said semiconductor memory device has a standby mode and an active mode, and said precharge circuit is always active in said standby mode and active for a prescribed period before said address is applied in said active mode.

9. The semiconductor memory device according to claim 5, wherein a plurality of predecode signals are respectively allocated in advance to said plurality of memory cells, said semiconductor memory device further comprises a predecoder selecting any one of said plurality of predecode signals in accordance with an external address signal and setting the selected predecode signal to be at an active level, said decoder activates a corresponding memory cell in response to a predecode signal allocated to the corresponding memory cell set to be at the active level, and said first transistor receives, at an input electrode of said first transistor, a predecode signal corresponding to a corresponding memory cell, and is rendered conductive in response to the predecode signal set to be at the active level.

\* \* \* \* \*

UNITED STATES PATENT AND TRADEMARK OFFICE
CERTIFICATE OF CORRECTION

PATENT NO.   : 6,335,886 B1
DATED        : January 1, 2002
INVENTOR(S)  : Takehiro Ochi et al.

It is certified that error appears in the above-identified patent and that said Letters Patent is hereby corrected as shown below:

<u>Column 7,</u>
Line 24, replace "OR" with -- ΦR --

Signed and Sealed this

Eleventh Day of June, 2002

Attest:

JAMES E. ROGAN
Director of the United States Patent and Trademark Office

Attesting Officer